US012646579B2

(12) United States Patent
Ahn et al.

(10) Patent No.: US 12,646,579 B2
(45) Date of Patent: Jun. 2, 2026

(54) INTEGRATED CIRCUIT, DATA DRIVING APPARATUS, AND CHIP-ON-FILM PACKAGE

(71) Applicant: LX Semicon Co., Ltd., Daejeon (KR)

(72) Inventors: Yong Sung Ahn, Daejeon (KR); Hyo Joong Kim, Daejeon (KR); Kyu Tae Lee, Daejeon (KR); Hyun Soo Lee, Daejeon (KR); Jun Seong Im, Dajeon (KR)

(73) Assignee: LX SEMICON CO., LTD., Daejeon (KR)

( * ) Notice: Subject to any disclaimer, the term of this patent is extended or adjusted under 35 U.S.C. 154(b) by 518 days.

(21) Appl. No.: 18/296,765

(22) Filed: Apr. 6, 2023

(65) Prior Publication Data

US 2023/0402419 A1 Dec. 14, 2023

(30) Foreign Application Priority Data

Jun. 13, 2022 (KR) ........................ 10-2022-0071723
Sep. 14, 2022 (KR) ........................ 10-2022-0115480

(51) Int. Cl.
| | |
|---|---|
| *G11C 19/00* | (2006.01) |
| *G09G 3/20* | (2006.01) |
| *H10W 70/65* | (2026.01) |
| *H10W 72/20* | (2026.01) |
| *H10W 90/00* | (2026.01) |

(52) U.S. Cl.
CPC ............... *G11C 19/00* (2013.01); *G09G 3/20* (2013.01); *H10W 70/65* (2026.01); *G09G 2310/027* (2013.01); *G09G 2310/0286* (2013.01); *G09G 2310/0291* (2013.01); *H10W 72/248* (2026.01); *H10W 90/724* (2026.01)

(58) Field of Classification Search
None
See application file for complete search history.

(56) References Cited

U.S. PATENT DOCUMENTS

2016/0035321 A1* 2/2016 Cho ..................... G09G 3/2092
345/213
2017/0229060 A1 8/2017 Sakamaki et al.
2019/0326274 A1* 10/2019 Lee ......................... H01L 25/04

FOREIGN PATENT DOCUMENTS

JP 2017142359 A 8/2017

* cited by examiner

*Primary Examiner* — Hung K Vu
(74) *Attorney, Agent, or Firm* — Polsinelli PC

(57) ABSTRACT

A chip-on-film package includes plurality of bumps may be arranged on an integrated circuit, and a plurality of metallic lines are connected to the bumps, thereby transmitting data to a panel, and in a data driving apparatus which may be implemented as the integrated circuit, first bumps and second bumps may be arranged in the same direction in a staggered manner.

18 Claims, 10 Drawing Sheets

INTEGRATED CIRCUIT, DATA DRIVING APPARATUS, AND CHIP-ON-FILM PACKAGE

CROSS-REFERENCE TO RELATED APPLICATIONS

This application claims the priorities of Korean Applications Nos. 10-2022-0071723 filed on Jun. 13, 2022 and 10-2022-0115480 filed on Sep. 14, 2022, which are hereby incorporated by reference in their entirety.

BACKGROUND

Field of the Disclosure

The present disclosure relates to an integrated circuit, a data driving apparatus, and a chip-on-film package.

Description of the Background

With the development of the information society, various demands for display devices for displaying images are increasing. Various display devices, such as liquid crystal displays (LCDs) and light-emitting displays (LEDs) are being utilized. Light-emitting displays, among them, may be classified into organic light-emitting displays which use organic light-emitting diodes as light-emitting elements and light-emitting diode displays which use micro light-emitting diodes as light-emitting elements.

A display device includes a display panel including data lines, scan lines, and a plurality of pixels connected to the data lines and the scan lines, a scan driving circuit for supplying scan signals to the scan lines, and a data driving circuit for supplying data voltages to the data lines. As such, each of the plurality of pixels is supplied with a data voltage of a data line when a scan line is applied, and emits light with a predetermined brightness according to the applied data voltage.

The scan driving circuit (or scan driving device) and the data driving circuit (or data driving apparatus) may be formed as drive integrated circuits. In this case, the scan driving circuit and/or the data driving circuit may be attached onto a film substrate by a chip-on-film (COF) method. A configuration in which the drive integrated circuit is attached onto a film substrate by the COF method may be referred to as a "chip-on-film package".

According to an aspect, when an integrated circuit (IC) (e.g., drive IC) is attached onto a film substrate by the COF method (for example, when it is manufactured in a chip-on-film package), data for each channel may be transmitted to an external device (e.g., display panel) by connecting a metallic line (e.g., bump line) to each of multiple bumps arranged on the integrated circuit. In this instance, the bumps may be arranged on the integrated circuit in various configurations depending on the number of channels. Meanwhile, there are difficulties of having to modify the integrated circuit or develop an integrated circuit specifically for each type of arrangement, to properly configure multiple bumps on the integrated circuit based on how they are arranged.

The discussions in this section are only to provide background information and do not constitute an admission of prior art.

SUMMARY

Accordingly, the present disclosure is directed to an integrated circuit, a data driving apparatus, and a chip-onfilm package that substantially obviate one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide an integrated circuit, a data driving apparatus, and a chip-on-film package that are applicable to various arrangements of bumps on a single integrated circuit.

To achieve these and other advantages and in accordance with the present disclosure, as embodied and broadly described, an integrated circuit, a data driving apparatus, and a chip-on-film package that support both a 1-metal layer COF film and a 2-metal layer COF film on a single integrated circuit.

The present disclosure is also to provide an integrated circuit, a data driving apparatus, and a chip-on-film package that are applicable to various arrangements of bumps on a single integrated circuit through internal functional control.

In an aspect of the present disclosure, an integrated circuit includes first bumps arranged in a first direction; and second bumps arranged in the first direction and arranged in a staggered manner with respect to the first bumps, wherein the first bumps are configured to be connected to an external device through first metallic lines, and the second bumps are configured to be disconnected from the external device.

In another aspect of the present disclosure, a data driving apparatus includes first bumps arranged in a first direction; second bumps arranged in the first direction and arranged in a staggered manner with respect to the first bumps; a first shift register configured to process first data corresponding to the first bumps; and a second shift register configured to process second data corresponding to the second bumps, wherein the second shift register is configured to be disabled in a first mode.

A further aspect of the present disclosure, a chip-on-film package includes an integrated circuit comprising first bumps arranged in a first direction; and second bumps arranged in the first direction and arranged in a staggered manner with respect to the first bumps; and a film substrate connected to the first bumps through first metallic lines and disconnected from the second bumps.

As set forth above, according to the present disclosure, a single integrated circuit may be applicable to various arrangements of bumps. For example, both a 1-metal layer COF film and a 2-metal layer COF film may be supported on a single integrated circuit.

Furthermore, according to the present disclosure, a single integrated circuit may be applicable to various arrangements of bumps through internal functional control, without replacing the integrated circuit.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 3 is a plan view of a chip-on-film package according to an aspect of the present disclosure;

FIG. 4 is a plan view of a chip-on-film package according to an aspect of the present disclosure;

FIG. 6 is a plan view of a chip-on-film package according to an aspect of the present disclosure;

FIG. 7 is a plan view of a chip-on-film package according to an aspect of the present disclosure;

DETAILED DESCRIPTION

Reference will now be made in detail to the aspects of the present disclosure, examples of which are illustrated in the accompanying drawings. Wherever possible, the same reference numbers will be used throughout the drawings to refer to the same or like parts.

Figure 1:
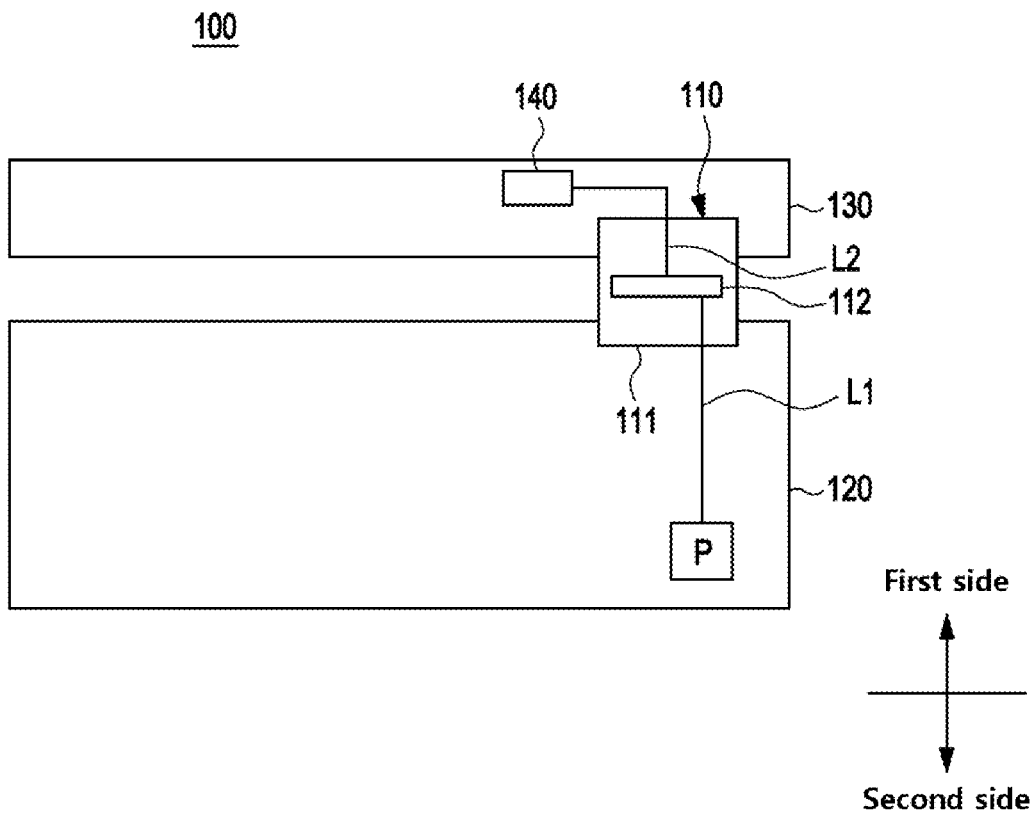
FIG. 1 is a configuration diagram of a display device according to an aspect of the present disclosure.

FIG. 1 is a configuration diagram of a display device according to an aspect of the present disclosure.

Referring to FIG. 1, the display device 100 may include a chip-on-film package 110, a display panel 120, a circuit substrate 130, and so on. The chip-on-film package 110 may include a film substrate 111 and an integrated circuit 112 (e.g., semiconductor chip).

The display device 100 may be composed of a plurality of pixels P and control circuits for driving the pixels P. The plurality of pixels P may be arranged on the display panel 120, and the control circuits may be arranged on the chip-on-film package 110 and/or the circuit substrate 130.

A plurality of data lines and gate lines may be arranged on the display panel 120, and pixels P may be defined by intersections of the data lines and the gate lines. The brightness of the pixels P may be determined by a data driving signal—for example, data voltage—supplied through the data lines. Such a data driving signal may be supplied by the integrated circuit 112 (e.g., semiconductor chip) disposed on the chip-on-film package 110. The display panel 120 may further include a driving circuit. The driving circuit may be, for example, a gate driving circuit for supplying a scan signal to the gate lines, or a touch driving circuit for supplying a touch driving signal to a touch sensor interfaced with the display panel 120.

The integrated circuit 112—for example, a source driver—may generate a data driving signal for driving the data lines of the display panel 120. Such a data driving signal may be generated using image data received from a control circuit 140, for example, timing controller, disposed on the circuit substrate 130. The image data may include a digital value that indicates the brightness of each pixel P. The integrated circuit 112 may convert such a digital value into an analog signal, e.g., a data driving signal, and output it to the display panel 120.

Metallic lines L1 and L2 (e.g., bump lines) for electrically connecting the integrated circuit (e.g., semiconductor chip) and other external devices (e.g., the circuit substrate 130, the display panel 120, etc.) may be arranged on the chip-on-film package 110. The metallic lines L1 and L2 may be electrically connected to bumps formed on one side of the integrated circuit 112.

Figure 2A:
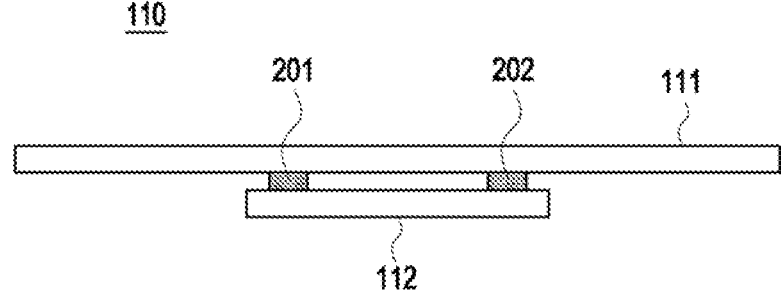
FIG. 2A is a side view of a chip-on-film package according to an aspect of the present disclosure.

FIG. 2A is a side view of a chip-on-film package according to an aspect of the present disclosure.

Referring to FIG. 2A, the chip-on-film package 110 may include a film substrate 111 and an integrated circuit 112 (e.g., semiconductor chip), and may be electrically connected to the film substrate 111 through bumps 201 and 202 formed on the integrated circuit 112.

Referring again to FIG. 1, the circuit substrate 130 may be connected to a first side of the chip-on-film package 110, and the display panel 120 may be connected to a second side thereof. Some (e.g., L2) of the plurality of metallic lines L1 and L2 may be connected to the circuit substrate 130 as it extends to the first side of the integrated circuit 112. Also, the others (e.g., L1) of the plurality of metallic lines L1 and L2 may be connected to the display panel 120 as it extends to the second side of the integrated circuit 112.

Also, the integrated circuit 112 may receive image data from the control circuit 140 through the metallic line L2 connected to the first side, and may output a data driving signal to the display panel 120 through the metallic line L1 connected to the second side.

Figure 2B:
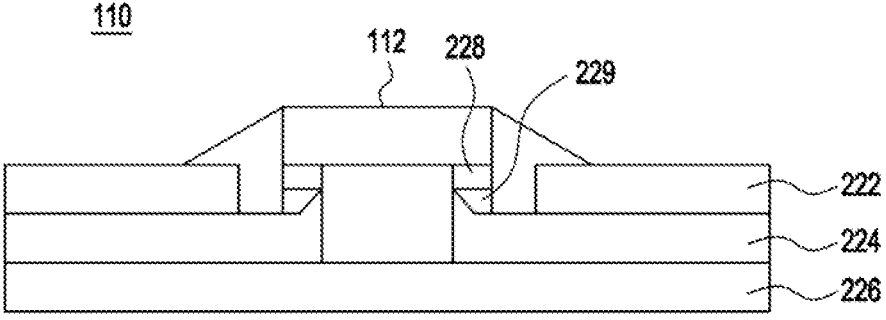
FIG. 2B is a cross-sectional view of a chip-on-film package according to an aspect of the present disclosure.

FIG. 2B is a cross-sectional view of a chip-on-film package according to an aspect of the present disclosure.

Referring to FIG. 2B, the chip-on-film package 110 may include an integrated circuit 112 (e.g., semiconductor chip), an insulating layer 222, a line layer 224, a film layer 226, a pad 229, and so on. At least some of the insulating layer 222, the line layer 224, the film layer 226, and the pad 229 may correspond to the film substrate 111 of FIG. 1.

The film layer 226 may be a polyimide film. A line layer 224 including a plurality of lines may be disposed on the film layer 226. Referring to FIG. 1, a metallic line (e.g., L1 or L2 of FIG. 1) (or bump line) explained with reference to FIG. 1 may be included in the line layer 224. The line layer 224 may be composed of a metallic member, for example, copper, and may be electrically connected to the integrated circuit 112 through the pad 229.

To strengthen the insulation of the line layer 224 and protect the lines from external impact, the insulating layer 222 may be positioned over the line layer 224. For the insulating layer 222, materials known as surface resists (SR) may be used. The insulating layer 222 may be removed from where the pad 229 is formed, and the line layer 224 may be exposed to the outside.

The integrated circuit 112 may include a driver IC (integrated circuit) (e.g., source driver) for driving the display panel 120. The driver IC may drive the display panel 120 by processing a signal received from the control circuit 140 disposed on the circuit substrate 130.

As the bumps 228 formed on a lower surface of the integrated circuit 112 are joined to exposed portions of the line layer 224, i.e., portions where the insulating layer 222 is not formed, the integrated circuit 112 and the metallic lines L1 and L2 (e.g., bump lines) may be electrically connected.

Figure 3:
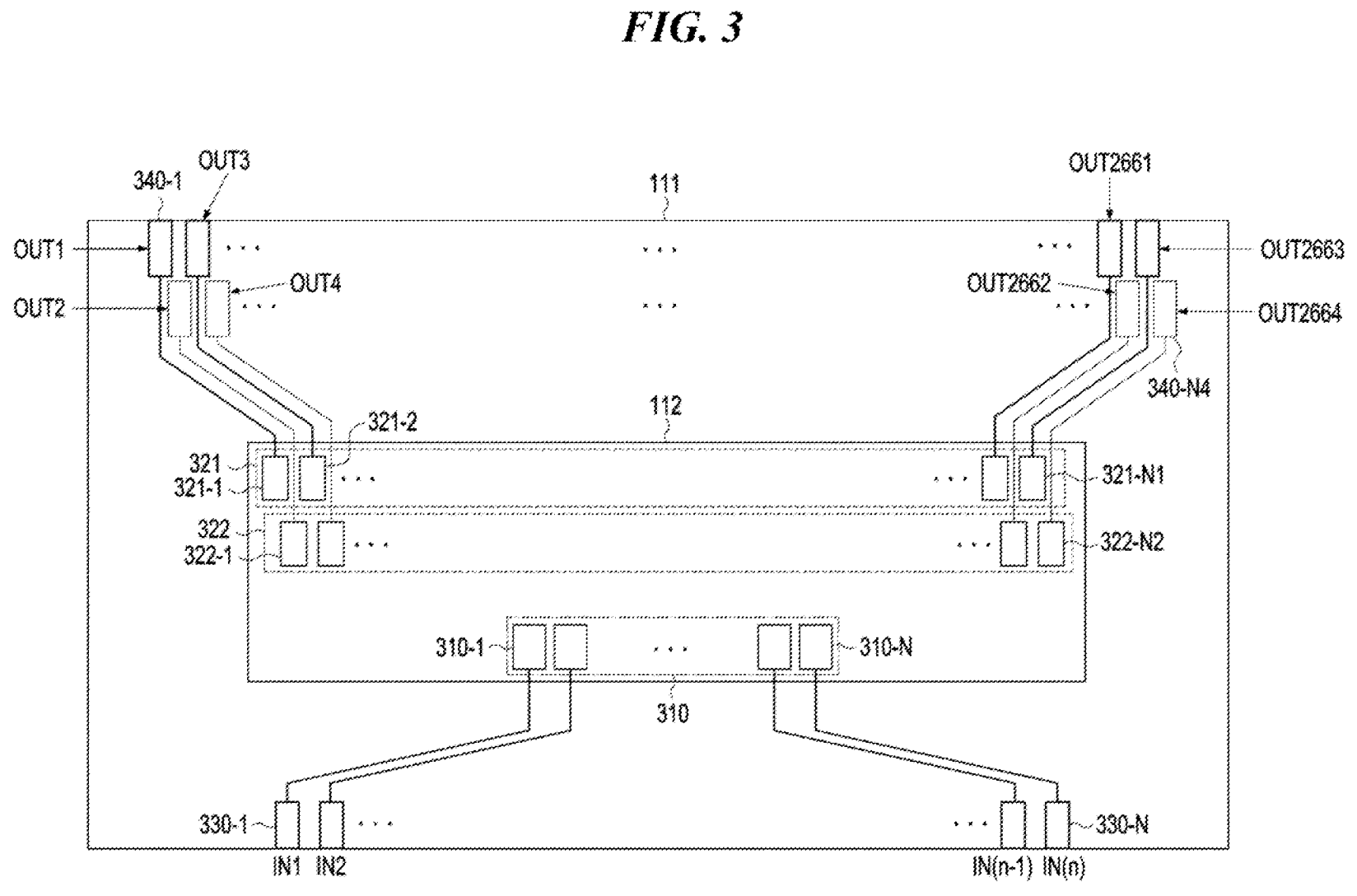

FIG. 3 is a plan view of a chip-on-film package according to an aspect of the present disclosure.

Referring to FIG. 3, the chip-on-film package 110 may include a film substrate 111 and an integrated circuit 112.

A plurality of bumps may be arranged on one side of the integrated circuit 112 (e.g., semiconductor chip). For example, a plurality of input bumps 310-1, 310-2, . . . , 310-N may be arranged in a first direction in a first region 310 of the integrated circuit 112. The plurality of input bumps 310-1, 310-2, . . . , 310-N may be connected to input terminals IN1, IN2, IN(n) on the film substrate 111 through a plurality of input lines 330-1, 330-2, . . . , 330-N, respectively.

A plurality of output bumps 321-1, 321-2, . . . , 321-N1, 322-1, 322-2, . . . , 322-N2 may be arranged in the first direction in a (2-1)th region 321 and (2-2)th region 322 of the integrated circuit 112. For example, a plurality of first bumps 321-1, 321-2, . . . , 321-N1 may be arranged in the first direction in the (2-1)th region 321 of the integrated circuit 112. A plurality of second bumps 322-1, 322-2, . . . , 322-N2 may be arranged in the first direction in the (2-2)th region 322 of the integrated circuit 112.

According to an aspect, as shown in FIG. 3, the plurality of second bumps 322-1, 322-2, . . . , 322-N2 arranged in the (2-2) th region 322 may be arranged in a staggered manner with respect to the plurality of first bumps 321-1, 321-2, . . . , 321-N1 arranged in the (2-1) th region 321. According to an aspect, the plurality of second bumps 322-1, 322-2, . . . , 322-N2 arranged in the (2-2) th region 322 may be connected to a metal layer different from the one to which the plurality of first bumps 321-1, 321-2, . . . , 321-N1 arranged in the (2-1) th region 321 is connected. For example, the plurality of second bumps 322-1, 322-2, . . . , 322-N2 arranged in the (2-2) th region 322 may be connected to a first metal layer, and the plurality of first bumps 321-1, 321-2, . . . , 321-N1 arranged in the (2-1) th region 321 may be connected to a second metal layer. By connecting the second bumps 322-1, 322-2, . . . , 322-N2 and the first bumps 321-1, 321-2, . . . , 321-N1 to different metal layers, metallic lines may be arranged at narrower intervals when viewed from a plane. As shown in FIG. 3, a configuration in which the second bumps 322-1, 322-2, . . . , 322-N2 and the first bumps 321-1, 321-2, . . . , 321-N1 are connected to different layers may be referred to as "2-metal layer COF", but is not limited to this term.

According to an aspect, the plurality of first bumps 321-1, 321-2, . . . , 321-N1 arranged in the (2-1) th region 321 and the plurality of second bumps 322-1, 322-2, . . . , 322-N2 arranged in the (2-2) th region 322 may be connected to metallic lines in an alternating manner. For example, the (1-1) th bump 321-1, the (2-1) th bump 322-1, the (1-2) th bump 321-2, the (2-2) th bump 322-2, . . . (1-N1) th bump 321-N1, and the (2-N2) th bump 322-N2 may be connected to metallic lines 340-1, 340-2, . . . , 340-N4, respectively. For example, assuming that there are 2,664 output terminals OUT1, OUT2, OUT2664 on the film substrate 111, 1,332 odd-numbered output terminals OUT1, OUT3, OUT2663 may be connected to the plurality of first bumps 321-1, 321-2, . . . , 321-N1 through the first metallic lines 340-1, 340-3, . . . and 1,332 even-numbered output terminals OUT2, OUT4, OUT2664 may be connected to the plurality of second bumps 322-1, 322-2, . . . , 322-N2 through the second metallic lines 340-2, 340-4, . . . , 340-N4.

Figure 4:
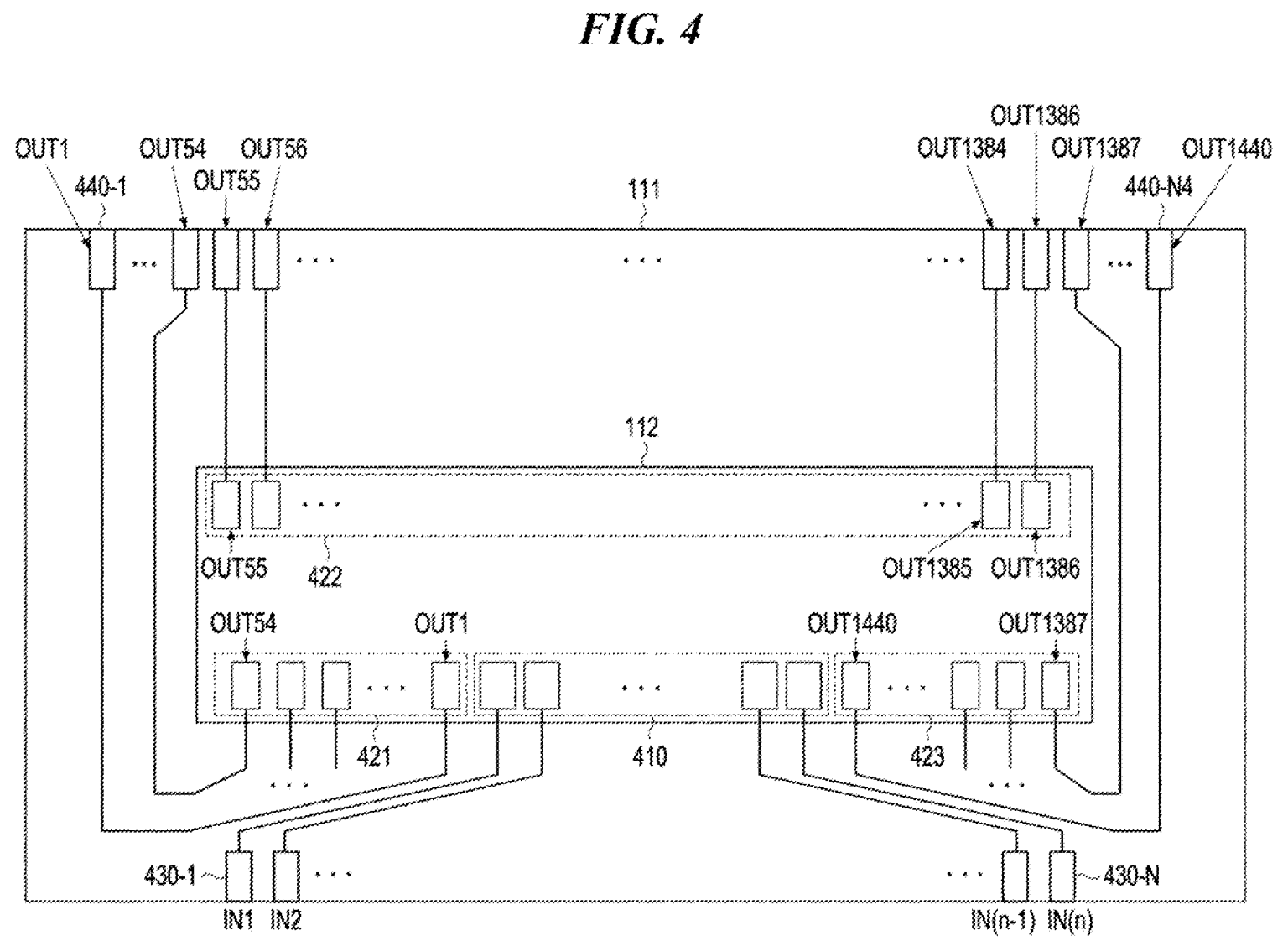

FIG. 4 is a plan view of a chip-on-film package according to an aspect of the present disclosure.

Referring to FIG. 4, the chip-on-film package 110 may include a film substrate 111 and an integrated circuit 112.

A plurality of bumps may be arranged on one side of the integrated circuit 112 (e.g., semiconductor chip). For example, a plurality of input bumps 410-1, 410-2, . . . , 410-N may be arranged in a first direction in a first region 410 of the integrated circuit 112. The plurality of input bumps 410-1, 410-2, . . . , 410-N may be connected to input terminals IN1, IN2, IN(n) on the film substrate 111 through a plurality of input lines 430-1, 430-2, . . . , 430-N, respectively.

A plurality of output bumps may be arranged in the first direction in a (2-1)th region 421, (2-2)th region 422, and (2-3)th region 423 of the integrated circuit 112. For example, 54 bumps (e.g., OUT1 to OUT54) may be arranged in the first direction in the (2-1)th region 421 of the integrated circuit 112, 1,332 bumps (e.g., OUT55 to OUT1386) may be arranged in the first direction in the (2-2)th region 422, and 54 bumps (e.g., OUT1387 to OUT1440) may be arranged in the first direction in the (2-3)th region 423.

According to an aspect, the plurality of output bumps arranged in the (2-1) th region 421, the (2-2) th region 422, and the (2-3) th region 423 may be connected to the same metal layer. As shown in FIG. 4, a configuration in which the plurality of output bumps arranged in the (2-1) th region 421, the (2-2) th region 422, and the (2-3) th region 423 are connected to the same metal layer may be referred to as "1-metal layer COF", but is not limited to this term. According to an aspect, the plurality of output bumps may be connected to metallic lines in the order of the (2-1) th region 421, the (2-2) th region 422, and the (2-3) th region 423.

Figure 5:
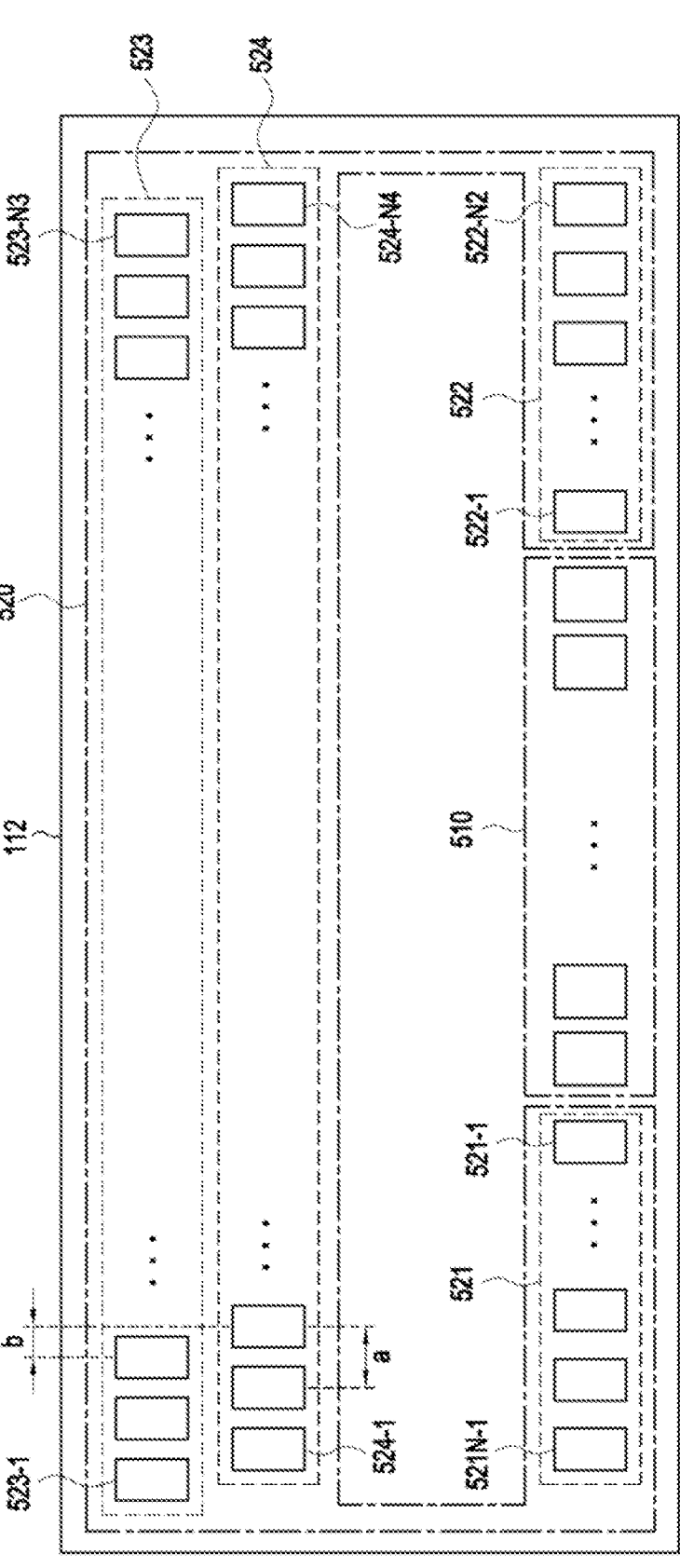
FIG. 5 is a plan view of an integrated circuit according to an aspect of the present disclosure.

FIG. 5 is a plan view of an integrated circuit according to an aspect of the present disclosure.

Referring to FIG. 5, according to an aspect, a plurality of bumps may be arranged on one side of the integrated circuit 112 (e.g., semiconductor chip). For example, a plurality of input bumps may be arranged in a first direction in a first region 510 of the integrated circuit 112. The plurality of input bumps may be connected to input terminals IN1, IN2, . . . , IN (n) on the film substrate 111 through a plurality of input lines, respectively.

A plurality of output bumps 521-1, 521-2, . . . , 521-N1, 522-1, 522-2, . . . , 522-N2, 523-1, 523-2, . . . , 523-N3, 524-1, 524-2, . . . , 524-N4 may be arranged in the first direction in a (2-1)th region 521, (2-2)th region 522, (2-3)th region 523, and (2-4)th region 524 of the integrated circuit 112. For example, a plurality of first bumps 521-1, 521-2, . . . , 521-N1 may be arranged in the first direction in the (2-1)th region 521 of the integrated circuit 112. A plurality of second bumps 522-1, 522-2, . . . , 522-N2 may be arranged in the first direction in the (2-2)th region 522 of the integrated circuit 112. A plurality of third bumps 523-1, 523-2, . . . , 523-N3 may be arranged in the (2-3)th region 523 of the integrated circuit 112. A plurality of fourth bumps 524-1, 524-2, . . . , 524-N4 may be arranged in the first direction in the (2-4)th region 524 of the integrated circuit 112.

According to an aspect, as shown in FIG. 5, the plurality of third bumps 523-1, 523-2, . . . , 523-N3 arranged in the (2-3) th region 523 may be arranged in a staggered manner with respect to the plurality of fourth bumps 524-1, 524-2, . . . , 524-N4 arranged in the (2-4) th region 524. According to an aspect, the plurality of third bumps 523-1, 523-2, . . . , 523-N3 arranged in the (2-3) th region 523 may be connected to a metal layer different from the one to which the plurality of fourth bumps 524-1, 524-2, . . . , 524-N4 arranged in the (2-4) th region 524 is connected. For example, the plurality of third bumps 523-1, 523-2, . . . , 523-N3 arranged in the (2-3) th region 523 may be connected to a second metal layer, and the plurality of fourth bumps 524-1, 524-2, . . . , 524-N4 arranged in the (2-4) th region 524 may be connected to a first metal layer. By connecting the third bumps 523-1, 523-2, . . . , 523-N3 and the fourth bumps 524-1, 524-2, . . . , 524-N4 to different metal layers, metallic lines may be arranged at narrower intervals when viewed from a plane. For example, as shown in FIG. 5, the bumps in the same region may be arranged in such a way that their centers or the metallic lines are spaced apart by a distance of a. On the other hand, the bumps in the (2-3) th region 523 and the bumps in the (2-4) th region 524 are arranged in a staggered manner, so the metallic lines connected to the bumps may be spaced apart by a distance of b (e.g., b=1/a) which is smaller than a, when viewed from a plane.

According to an aspect, when the third bumps 523-1, 523-2, . . . , 523-N3 and the fourth bumps 524-1, 524-2, . . . , 524-N4 are connected to different metal layers, a "2-metal layer COF" may be formed. According to another aspect, when the third bumps 523-1, 523-2, . . . , 523-N3 are connected to an external device (e.g., display panel 120) through metallic lines, and the fourth bumps 524-1, 524-2, . . . , 524-N4 are disconnected from the external device (for example, the metallic lines are not connected to the bumps, or the bumps are not connected to the film substrate), a "1-metal layer COF" may be formed. In this way, some of the bumps (e.g., the bumps in the (2-4) th region 524) arranged on the integrated circuit 112 may be selectively connected, thereby supporting various types of COFs (e.g., 1-metal layer COF or 2-metal layer COF) through a single integrated circuit 112. According to an aspect, if the integrated circuit 112 has a relatively small number of channels to be connected to an external device, some of the bumps (e.g., the bumps in the (2-4) th region 524) may be disconnected.

Although the foregoing FIG. 5 illustrates an aspect in which a "2-metal layer COF" is formed by connecting the third bumps 523-1, 523-2, . . . , 523-N3 and the fourth bumps 524-1, 524-2, . . . , 524-N4 to different metal layers, the aspects to be described below are not limited to it, and a "3-metal layer COF" or a "4-metal layer COF" may be formed by arranging three or more layers in a staggered manner according to various aspects.

Hereinafter, referring to FIGS. 6 and 7, an aspect in which the 1-metal layer COF or the 2-metal layer COF are supported using the above-described integrated circuit 112 of FIG. will be described.

Figure 6:
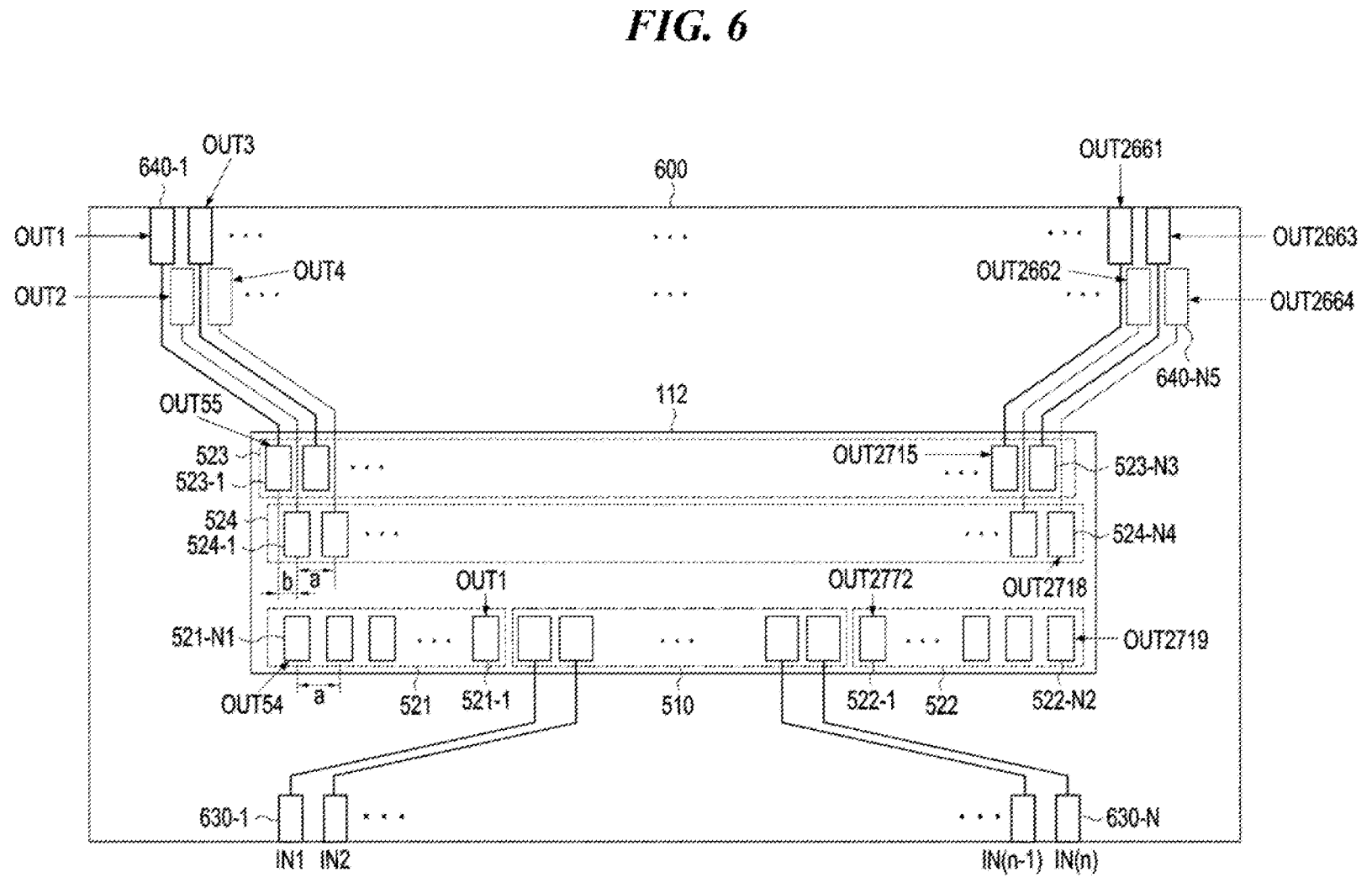

FIG. 6 is a plan view of a chip-on-film package according to an aspect of the present disclosure.

Referring to FIG. 6, the chip-on-film package 110 may include a film substrate 600 and an integrated circuit 112.

According to an aspect, a plurality of bumps may be arranged on one side of the integrated circuit 112 (e.g., semiconductor chip). For example, a plurality of input bumps may be arranged in a first direction in a first region 510 of the integrated circuit 112. The plurality of input bumps may be connected to input terminals IN1, IN2, . . . , IN (n) on the film substrate 600 through a plurality of input lines 630-1, 630-2, . . . , 630-N, respectively.

According to an aspect, as shown in FIG. 6, the plurality of third bumps 523-1, 523-2, . . . , 523-N3 arranged in the (2-3) th region 523 may be arranged in a staggered manner with respect to the plurality of fourth bumps 524-1, 524-2, . . . , 524-N4 arranged in the (2-4) th region 524. According to an aspect, the plurality of third bumps 523-1, 523-2, . . . , 523-N3 arranged in the (2-3) th region 523 may be connected to a metal layer different from the one to which the plurality of fourth bumps 524-1, 524-2, . . . , 524-N4 arranged in the (2-4) th region 524 is connected. For example, the plurality of third bumps 523-1, 523-2, . . . , 523-N3 arranged in the (2-3) th region 523 may be connected to a second metal layer, and the plurality of fourth bumps 524-1, 524-2, . . . , 524-N4 arranged in the (2-4) th region 524 may be connected to a first metal layer. By connecting the third bumps 523-1, 523-2, . . . , 523-N3 and the fourth bumps 524-1, 524-2, . . . , 524-N4 to different metal layers, metallic lines may be arranged at narrower intervals when viewed from a plane. For example, as shown in FIG. 5, the bumps in the same region may be arranged in such a way that their centers or the metallic lines are spaced apart by a distance of a. On the other hand, the bumps in the (2-3) th region 523 and the bumps in the (2-4) th region 524 are arranged in a staggered manner, so the metallic lines connected to the bumps may be spaced apart by a distance of b (e.g., b=1/a) which is smaller than a, when viewed from a plane.

According to an aspect, when the third bumps 523-1, 523-2, . . . , 523-N3 and the fourth bumps 524-1, 524-2, . . . , 524-N4 are connected to different metal layers, a "2-metal layer COF" may be formed. According to an aspect, the plurality of third bumps 523-1, 523-2, . . . , 523-N3 arranged in the (2-3) th region 523 and the plurality of fourth bumps 524-1, 524-2, . . . , 524-N4 arranged in the (2-4) th region 524 may be connected to metallic lines in an alternating manner. For example, the (3-1) th bump 523-1, the (4-1) th bump 524-1, the (3-2) th bump 523-2, the (4-2) th bump 524-2, . . . (3-N3) th bump 523-N3, and the (4-N4) th bump 524-N4 may be connected to metallic lines 640-1, 640-2, . . . , 640-N5, respectively. For example, assuming that there are 2, 664 output terminals OUT1, OUT2, OUT2664 on the film substrate 600, 1,332 odd-numbered output terminals OUT1, OUT3, OUT2663 may be connected to the plurality of third bumps 523-1, 523-2, . . . , 523-N3 through the first metallic lines 640-1, 640-3, . . . and 1,332 even-numbered output terminals OUT2, OUT4, OUT2664 may be connected to the plurality of fourth bumps 524-1, 524-2, . . . , 524-N4 through the second metallic lines 640-2, 640-4, . . . , 640-N5. According to an aspect, first bumps 521-1, 521-2, . . . , 521-N1 and second bumps 522-1, 522-2, . . . , 522-N2 may be configured not to be connected to an external device (e.g., display panel 120) through metallic lines, but to be disconnected from it.

Figure 7:
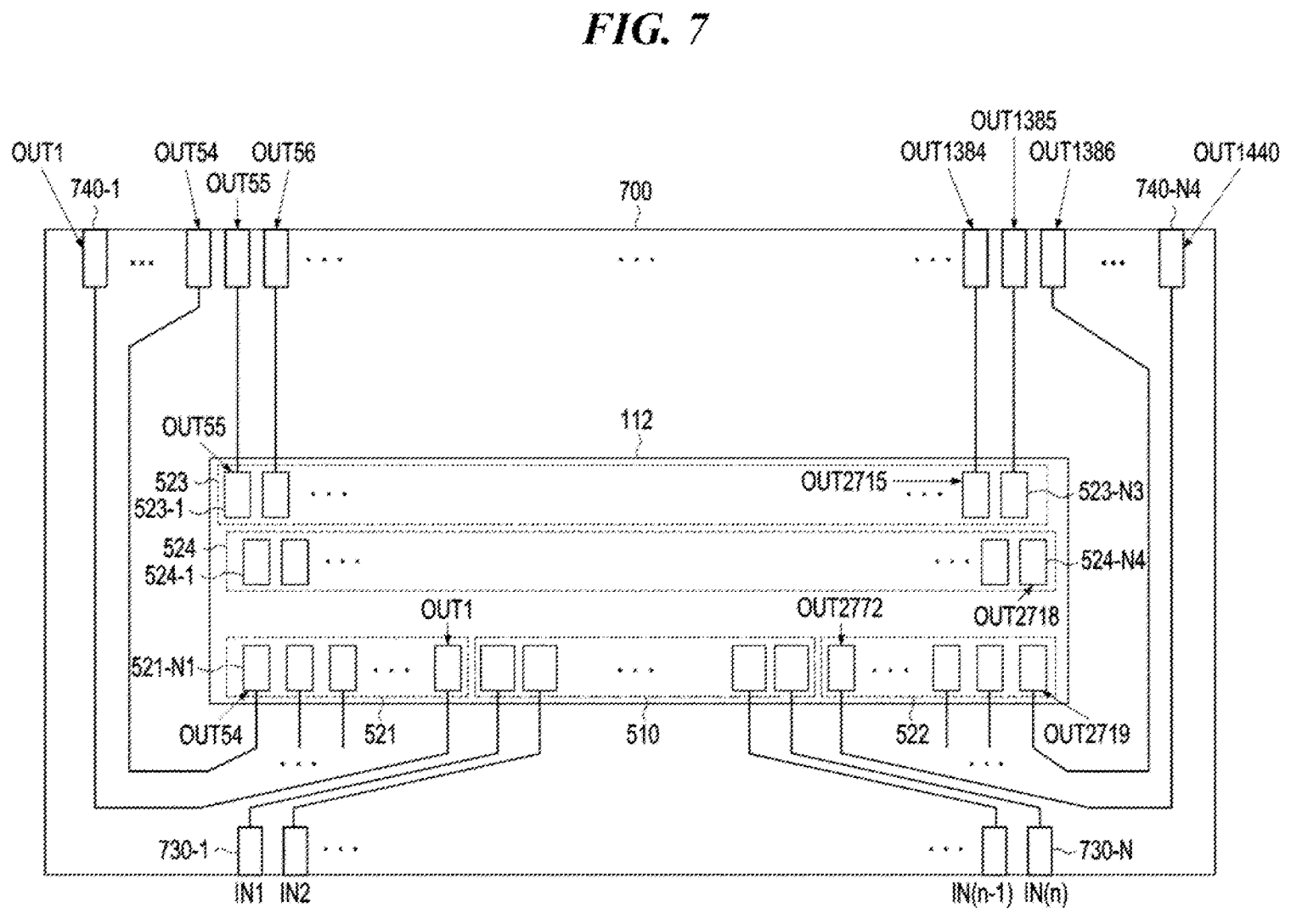

FIG. 7 is a plan view of a chip-on-film package according to an aspect of the present disclosure.

Referring to FIG. 7, the chip-on-film package 110 may include a film substrate 700 and an integrated circuit 112.

According to an aspect, a plurality of bumps may be arranged on one side of the integrated circuit 112 (e.g., semiconductor chip). For example, a plurality of input bumps may be arranged in a first direction in a first region 510 of the integrated circuit 112. The plurality of input bumps may be connected to input terminals IN1, IN2, . . . , IN (n) on the film substrate 700 through a plurality of input lines 730-1, 730-2, . . . , 730-N, respectively.

According to an aspect, as shown in FIG. 7, the plurality of third bumps 523-1, 523-2, . . . , 523-N3 arranged in the (2-3) th region 523 may be arranged in a staggered manner with respect to the plurality of fourth bumps 524-1, 524-2, . . . , 524-N4 arranged in the (2-4) th region 524. According to an aspect, the plurality of third bumps 523-1, 523-2, . . . , 523-N3 arranged in the (2-3) th region 523 may be connected to the film substrate 700 through metallic lines. On the other hand, the plurality of fourth bumps 524-1, 524-2, . . . , 524-N4 arranged in the (2-4) th region 524 may be configured not to be connected to an external device (e.g., display panel 120) through metallic lines, but to be disconnected from it.

According to an aspect, a plurality of output bumps may be arranged in the first direction in a (2-1) th region 521, (2-2) th region 522, and (2-3) th region 523 of the integrated circuit 112. For example, 54 bumps (e.g., OUT1 to OUT54) may be arranged in the first direction in the (2-1) th region 521 of the integrated circuit 112, 54 bumps (e.g., OUT2719 to OUT2772) may be arranged in the first direction in the (2-2) th region 522, and 1332 bumps (e.g., OUT55 to OUT2715) may be arranged in the first direction in the (2-3) th region 523.

According to an aspect, the plurality of output bumps arranged in the (2-1) th region 521, the (2-2) th region 522, and the (2-3) th region 523 may be connected to the same metal layer. As shown in FIG. 7, a configuration in which the plurality of output bumps arranged in the (2-1) th region 521, the (2-2) th region 522, and the (2-3) th region 523 are connected to the same metal layer may be referred to as "1-metal layer COF", but is not limited to this term. According to an aspect, the plurality of output bumps (for example, first bumps 521-1, 521-2, . . . , 521-N1, second bumps 522-1, 522-2, . . . , 522-N2, and third bumps 523-1, 523-2, . . . , 523-N3) may be connected to metallic lines in the order of the (2-1) th region 521, the (2-2) th region 522, and the (2-3) th region 523. According to an aspect, the fourth bumps 524-1, 524-2, . . . , 524-N4 arranged in the (2-4) th region 524 may be disconnected from an external device. For example, the fourth bumps 524-1, 524-2, . . . , 524-N4 arranged in the (2-4) th region 524 may form a chip-on-film package 110 without connecting metallic lines to the bumps or without connecting the bumps to the film substrate.

Hereinafter, referring to FIGS. 8 to 10, a method of forming the chip-on-film package 110 as in FIG. 7 in such a way as to be disconnected inside the integrated circuit 112 will be described.

Figure 8:
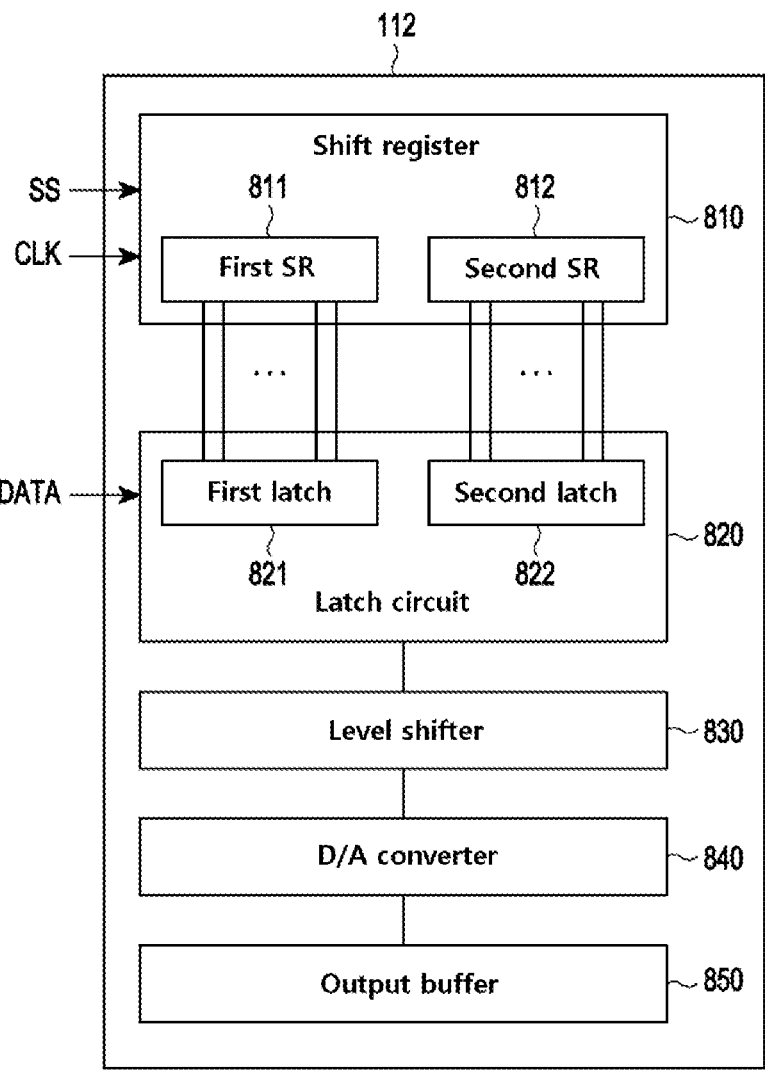
FIG. 8 is a block diagram of a data driving apparatus according to an aspect of the present disclosure.

FIG. 8 is a block diagram of a data driving apparatus according to an aspect of the present disclosure.

Referring to FIG. 8, the integrated circuit 112 (e.g., data driving circuit) may include a shift register 810, a latch circuit 820, a level shifter 830, a digital-to-analog converter (DAC) 840, and an output buffer 850.

The shift register 810 sequentially shifts a sampling start signal SS by using a clock signal CLK. According to an aspect, the shift register 810 may include a first shift register (first SR) 811 and a second shift register (second SR) 812. The first SR 811 may process data corresponding to odd-numbered bumps (for example, the third bumps 523-1, 523-2, . . . , 523-N3 arranged in the (2-3) th region 523 of FIG. 5) among the plurality of bumps. The second SR 812 may process data corresponding to even-numbered bumps (for example, the fourth bumps 524-1, 524-2, . . . , 524-N4 arranged in the (2-4) th region 524 of FIG. 5) among the plurality of bumps.

The latch circuit 820 may sequentially latch RGB image data (hereinafter, referred to as "data") of each channel supplied from the control circuit 140, by using a sampling start signal outputted from the shift register 810. The latch circuit 820 may include a first latch 821 and a second latch 822. The first latch 821 may sequentially latch RGB image data of a corresponding channel by using a sampling start signal outputted from the first SR 811. The second latch 822 may sequentially latch RGB image data of a corresponding channel by using a sampling start signal outputted from the second SR 812.

The level shifter 830 may be configured to shift and output the level of latch data LATCH DATA to receive the latch data LATCH DATA of the latch circuit 820 and process it in the D/A converter 840.

The D/A converter 840 may convert digital image data latched by the latch circuit 420 and level-shifted by the level shifter 830 into analog image data. For example, the analog image data may have a positive value or a negative value for a common voltage Vcom in accordance with a polarity signal POL.

The output buffer 850 may buffer and amplify the analog image data obtained by the conversion by the D/A converter 840 and output it to data lines D1 to DN corresponding to channels of pixels. For example, the output buffer 850 may include a power amplifier.

Figure 9:
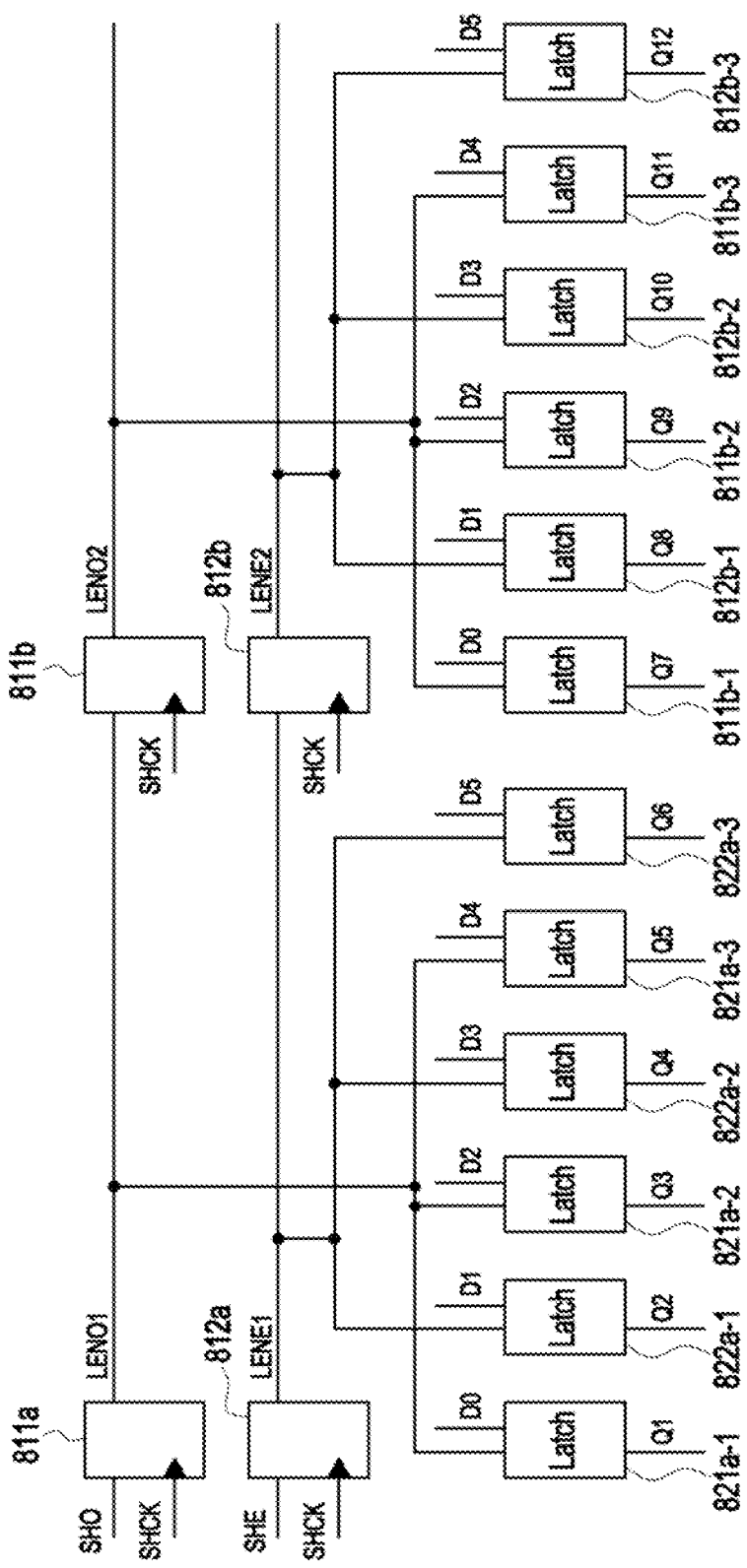
FIG. 9 is a circuit diagram showing shift registers and latches of a data driving apparatus according to an aspect of the present disclosure.

FIG. 9 is a circuit diagram showing shift registers and latches of a data driving apparatus according to an aspect of the present disclosure.

Referring to FIG. 9, the first SR 811 and the second SR 812 may receive signals in parallel. For example, the first SR 811 (811a and 811b) may receive odd-numbered data SHO and sequentially output data LENO1 and LENO2 to the first latch 821 (821a-1, 821a-2, 821a-3, 821b-1, 821b-2, and 821b-3). The second SR 812 (812a and 812b) may receive even-numbered data SHE and sequentially output data LENE1 and LENE2 to the second latch 822 (822a-1, 822a-2, 822a-3, 822b-1, 822b-2, and 822b-3).

According to various aspects, in a case where the integrated circuit 112 is configured as a 1-metal layer COF-type chip-on-film package, as illustrated in FIG. 7, the second SR 812 may be controlled to become disabled. As the second SR 812 is controlled to become disabled, no data may be transmitted to the second latch 822. For example, referring to FIG. 7, since no metallic lines are connected to the bumps (e.g., the fourth bumps 524-1, 524-2, . . . , 524-N4 of FIG. 7) corresponding to the second SR 812, no data may be transmitted to the corresponding bumps (e.g., the fourth bumps 524-1, 524-2, . . . , 524-N4 of FIG. 7) by controlling the second SR 812 to become disabled. The integrated circuit 112 may set the connection state in FIG. 7 to a first mode, and may control the second SR 812 to become disabled as described above, while in the first mode. Information on the first mode and information related to the state of the first SR 811 and/or the second SR 812 may be stored in a memory provided inside or outside the integrated circuit 112.

According to another aspect, in a case where the integrated circuit 112 is configured as a 2-metal layer COF-type chip-on-film package, as illustrated in FIG. 6, both the first SR 811 and the second SR 812 may be controlled to become enabled. The integrated circuit 112 may set the connection state in FIG. 6 to a second mode, and may control both the first SR 811 and the second SR 812 to become enabled as described above, while in the second mode. Information on the second mode and information related to the state of the first SR 811 and/or the second SR 812 may be stored in a memory provided inside or outside the integrated circuit 112.

Figure 10:
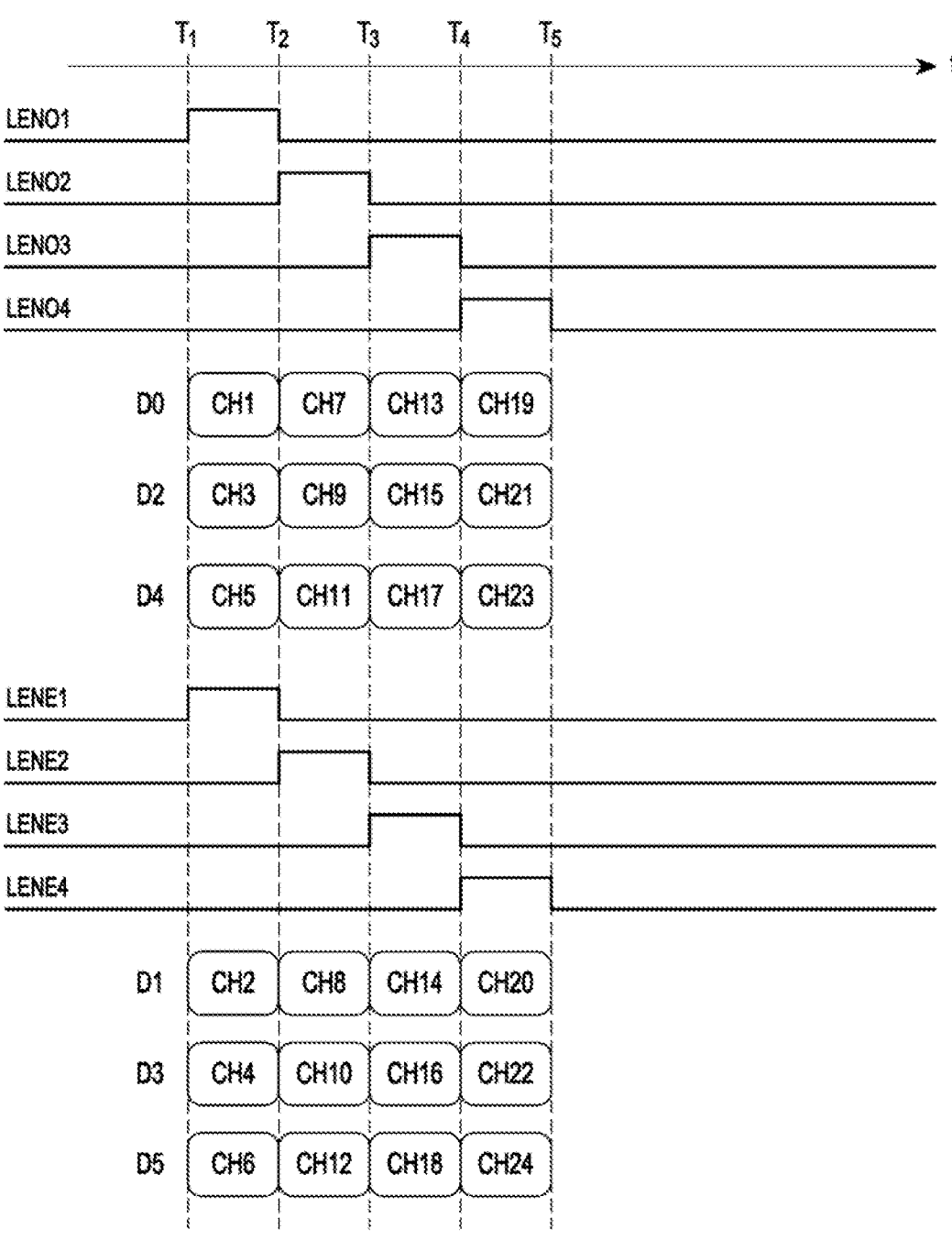
FIG. 10 is a view showing waveforms generated by operations of shift registers and latches of a data driving apparatus according to an aspect of the present disclosure.

FIG. 10 is a view showing waveforms generated by operations of shift registers and latches of a data driving apparatus according to an aspect of the present disclosure.

Referring to FIG. 10, the first SR 811 may process odd-numbered data, and the second SR 812 may process even-numbered data. Referring to FIG. 10, the first SR 811 may output LENO1 to "H" at time $T_1$, output LENO2 to "H" at time $T_2$, output LENO3 to "H" at time $T_3$, and output LENO4 to "H" at time T4. Accordingly, the first latch 821 connected to the first SR 811 may output data corresponding to odd-numbered channels alone.

According to an aspect, the second SR 812 may process data in parallel with the first SR 811. For example, the second SR 812 may output LENE1 to "H" at time T1, output LENE2 to "H" at time T2, output LENE3 to "H" at time T3, and output LENE4 to "H" at time T4. Accordingly, the second latch 822 connected to the second SR 812 may output data corresponding to even-numbered channels alone.

According to an aspect, in a case where the fourth bumps 524-1, 524-2, . . . , 524-N4 corresponding to the (2-4) th region 524 are used on the integrated circuit 112 without being connected to metallic lines, as illustrated in FIG. 7, no data may be outputted to the fourth bumps 524-1, 524-2, . . . , 524-N4. For example, in a case where the integrated circuit 112 is connected to the film substrate 700 as shown in FIG. 7, the operation mode of the integrated circuit 112 may be set to a first mode. Once the operation mode of the integrated circuit 112 is set to the first mode, the second SR 812 may be controlled to become disabled. As the second SR 812 is controlled to become disabled, no data may be outputted to the fourth bumps 524-1, 524-2, . . . , 524-N4 corresponding to the second SR 812. On the other hand, in a case where the integrated circuit 112 is connected to the film substrate 600 as shown in FIG. 6, the operation mode of the integrated circuit 112 may be set to a second mode. Once the operation mode of the integrated circuit 112 is set to the second mode, both the first SR 811 and the second SR 812 may be controlled to become abled. As both the first SR 811 and the second SR 812 are controlled to become abled, data may be properly outputted to the third bumps 523-1, 523-2, . . . , 523-N3 corresponding to the first SR 811 and the fourth bumps 524-1, 524-2, . . . , 524-N4 corresponding to the second SR 812.

As set forth above, according to the present disclosure, a single integrated circuit may be applicable to various arrangements of bumps. For example, both a 1-metal layer COF film and a 2-metal layer COF film may be supported on a single integrated circuit. Furthermore, according to the present disclosure, a single integrated circuit may be applicable to various arrangements of bumps through internal functional control, without replacing the integrated circuit.

It will be apparent to those skilled in the art that various modifications and variations can be made in the an integrated circuit, a data driving apparatus, and a chip-on-film package of the present disclosure without departing from the spirit or scope of the aspects. Thus, it is intended that the present disclosure covers the modifications and variations of the aspects provided they come within the scope of the appended claims and their equivalents.

What is claimed is:

1. An integrated circuit comprising:
first bumps arranged in a first direction; and
second bumps arranged in the first direction, and arranged in a staggered manner with respect to the first bumps,
wherein the first bumps are connected to an external device through first metallic lines, and the second bumps are disconnected from the external device,
wherein the first bumps and the second bumps are connected to different metal layers by metal lines, and
wherein a distance between metal lines is smaller than the distance between centers of the first bumps or the second bumps.

2. The integrated circuit of claim 1, wherein the integrated circuit is configured to operate in a first mode while the second bumps are disconnected from the external device, and to process a signal so as not to be transmitted to the second bumps in the first mode.

3. The integrated circuit of claim 2, wherein the integrated circuit comprises:
a first shift register configured to process first data corresponding to the first bumps; and
a second shift register configured to process second data corresponding to the second bumps,
wherein the second shift register is disabled in the first mode.

4. The integrated circuit of claim 2, wherein the integrated circuit further comprises third bumps arranged in the first direction and connected to the external device in a second direction different from the first bumps,
wherein the third bumps are connected to the external device through third metallic lines, respectively, while the second bumps are disconnected from the external device.

5. The integrated circuit of claim 2, wherein the integrated circuit is configured to operate in a second mode while the second bumps are connected to the external device through second metallic lines, respectively, and to process a signal so as not to be transmitted to the second bumps in the second mode.

6. The integrated circuit of claim 1, wherein the integrated circuit comprises a source driver for transmitting image data to the external device.

7. The integrated circuit of claim 1, wherein the integrated circuit further comprises a memory for storing configuration information related to the first mode.

8. A data driving apparatus comprising:
first bumps arranged in a first direction;
second bumps arranged in the first direction and arranged in a staggered manner with respect to the first bumps;
a first shift register configured to process first data corresponding to the first bumps; and
a second shift register configured to process second data corresponding to the second bumps, wherein the second shift register is configured to be disabled in a first mode,
wherein the first bumps and the second bumps are connected to different metal layers by metal lines, and
wherein a distance between metal lines is smaller than the distance between centers of the first bumps or the second bumps.

9. The data driving apparatus of claim 8, wherein the data driving apparatus is configured to operate in the first mode while the first bumps are connected to an external device through first metallic lines, respectively, and the second bumps are disconnected from the external device.

10. The data driving apparatus of claim 9, further comprising third bumps arranged in the first direction and connected to the external device in a second direction different from the first bumps,
wherein the third bumps are connected to the external device through third metallic lines, respectively, while the second bumps are disconnected from the external device.

11. The data driving apparatus of claim 9, wherein the data driving apparatus is configured to operate in a second mode while the second bumps are connected to the external device through second metallic lines, respectively, and to process a signal so as not to be transmitted to the second bumps in the second mode.

12. The data driving apparatus of claim 8, comprising a source driver for transmitting image data to the external device.

13. The data driving apparatus of claim 8, further comprising a memory for storing configuration information related to the first mode.

14. A chip-on-film package comprising:

an integrated circuit comprising first bumps arranged in a first direction and second bumps arranged in the first direction and arranged in a staggered manner with respect to the first bumps; and a film substrate connected to the first bumps through first metallic lines and disconnected from the second bumps, wherein the first bumps and the second bumps are connected to different metal layers by metal lines, and wherein a distance between metal lines is smaller than the distance between centers of the first bumps or the second bumps.

15. The chip-on-film package of claim 14, wherein the integrated circuit is configured to operate in a first mode while the second bumps are disconnected from the film substrate, and to process a signal so as not to be transmitted to the second bumps in the first mode.

16. The chip-on-film package of claim 15, wherein the integrated circuit comprises:

a first shift register configured to process first data corresponding to the first bumps; and a second shift register configured to process second data corresponding to the second bumps, wherein the second shift register is disabled in the first mode.

17. The chip-on-film package of claim 15, wherein the integrated circuit further comprises third bumps arranged in the first direction and connected to the external device in a second direction different from the first bumps, wherein the third bumps are connected to the external device through third metallic lines, respectively, while the second bumps are disconnected from the external device.

18. The chip-on-film package of claim 14, wherein the first bumps and the second bumps are connected to different metal layers on the film substrate.

* * * * *